United States Patent [19]

Ueno et al.

[11] Patent Number: 4,501,428
[45] Date of Patent: Feb. 26, 1985

[54] ROLL SEAL BOXES FOR CONTINUOUS VACUUM TREATING APPARATUS

[75] Inventors: Susumu Ueno; Kouiti Kuroda, both of Ibaraki; Hajime Kitamura, Ichihara; Masaie Tohkai, Ibaraki; Ken-ichi Kato, Tokyo; Nobuyuki Hiraishi, Katsuta, all of Japan

[73] Assignees: Hitachi, Ltd.; Shin-Etsu Chemical Co., Ltd., both of Tokyo, Japan

[21] Appl. No.: 621,373

[22] Filed: Jun. 18, 1984

[30] Foreign Application Priority Data

Jun. 17, 1983 [JP] Japan .................................. 58-107871
Jun. 17, 1983 [JP] Japan .................................. 58-107874

[51] Int. Cl.³ ............................ F16J 15/40; F16J 15/46
[52] U.S. Cl. ............................................ 277/12; 277/27; 277/DIG. 7; 118/733
[58] Field of Search ................... 277/12, 27, 32, 237, 277/DIG. 7; 118/733; 34/242

[56] References Cited

U.S. PATENT DOCUMENTS

| | | | |
|---|---|---|---|
| 3,299,676 | 1/1967 | Fujihashi | 277/DIG. 7 X |
| 3,326,177 | 6/1967 | Taylor | 118/733 X |
| 3,351,348 | 11/1967 | Dupuis | 277/32 |
| 3,367,667 | 2/1968 | Allen | 118/733 |
| 3,467,399 | 9/1969 | Kelly et al. | 277/DIG. 7 X |
| 3,643,058 | 2/1972 | Long | 277/DIG. 7 X |
| 4,048,953 | 9/1977 | Froberg | 118/733 X |

Primary Examiner—Robert S. Ward
Attorney, Agent, or Firm—Antonelli, Terry & Wands

[57] ABSTRACT

A continuous vacuum treating apparatus for subjecting a workpiece of soft material, such as a plastic molding to continuous surface treatment by an air-to-air system in vacuum, including a vacuum treating chamber and a plurality of auxiliary vacuum chambers located anterior and posterior to the vacuum treating chamber. The diameter of each of an upper seal roll and a lower seal roll of each of the auxiliary vacuum chambers located on the vacuum treating chamber side is smaller than the diameter of each of an upper seal roll and a lower seal roll of the auxiliary vacuum chamber located closest to the atmosphere.

5 Claims, 6 Drawing Figures

ROLL SEAL BOXES FOR CONTINUOUS VACUUM TREATING APPARATUS

BACKGROUND OF THE INVENTION

1. Field of the Invention

This invention relates to a continuous vacuum treating apparatus of an air-to-air system for continuously subjecting workpieces of soft material, such as plastic moldings, to surface treatment as with plasma in a vacuum treating chamber, wherein the plastic moldings refer to plastic films, plastic sheets, sheathed wires, etc.

2. Description of the Prior Art

In one type of continuous vacuum treating apparatus of the air-to-air system known in the art, a plurality of roll seal boxes composed of seal rolls of metal are arranged on the inlet side and the outlet side of a vacuum treating chamber, and a workpiece of hard material, such as a metal tape, is conveyed from the atmosphere into the vacuum treating chamber through the seal roll boxes to apply a coat of metal to the surface of the workpiece as by vaporization deposition in a vacuum and then the workpiece thus treated is returned to the atmosphere through auxiliary vacuum chambers. Such continuous vacuum treating apparatus is disclosed in U.S. Pat. No. 3,367,667, for example.

We have made a proposal to provide an apparatus for continuously subjecting workpieces of soft material, such as plastic sheets, by an air-to-air system in a vacuum chamber to surface treatment as with plasma. This apparatus includes a plurality of auxiliary vacuum chambers located both anterior and posterior to the vacuum treating chamber with each auxiliary vacuum chamber being composed primarily of a pair of seal rolls.

In the apparatus referred to hereinabove, an airtight seal is satisfactorily provided to the auxiliary vacuum chambers. However, problems have been raised with regard to obtaining a compact overall size in a continuous vacuum treating apparatus and economizing on power.

More specifically, in order that the workpiece may be conveyed in good condition, it is necessary that an axial deflection of the pair of seal rolls constituting each auxiliary vacuum chamber caused by pressure differential be kept below a predetermined value (50 μm for example). However, as subsequently to be described, a rise in the level of vacuum in the vacuum treating chamber can best be achieved by raising the level of vacuum in the auxiliary vacuum chamber located closest to the atmosphere. In this case, the differential pressure applied to the seal rolls is much smaller in the auxiliary vacuum chambers on the vacuum treating chamber side than in the auxiliary vacuum chamber closest to the atmosphere. Thus, in view of the need to keep the axial deflection of the seal rolls caused by pressure differential below the predetermined value, it is necessary to increase the diameter of the seal rolls in the auxiliary vacuum chamber closest to the atmosphere. It has hitherto been usual practice in the prior art to use the seal rolls of the same diameter for the auxiliary vacuum chamber located closest to the atmosphere and the auxiliary vacuum chambers disposed on the vacuum treating chamber side.

Owing to this constructional arrangement, leaks through side pieces on opposite end faces of the seal rolls have increased in volume as the diameter of the seal rolls increases, and this has inevitably increased the capacity of the vacuum pumps and the size of the auxiliary vacuum chambers. Also, it has become necessary to increase the power of a system for driving each pair of seal rolls.

SUMMARY OF THE INVENTION

(1) Object of the Invention

This invention has as its object the provision of a continuous vacuum treating apparatus enabling a compact size to be obtained in auxiliary vacuum chambers and allowing energy conservation to be achieved through a reduction in the drive force for driving the auxiliary vacuum chambers and the amount of air removed therefrom to make a vacuum.

(2) Statement of the Invention

To accomplish the aforesaid object, the invention provides in a continuous vacuum treating apparatus comprising a vacuum treating chamber and a plurality of auxiliary vacuum chambers located anterior and posterior to the vacuum treating chamber for continuously treating a workpiece in the vacuum treating chamber, the feature that the diameter of the seal rolls constituting each of the auxiliary vacuum chambers disposed on the vacuum treating chamber side is made smaller than the diameter of the seal rolls constituting the auxiliary vacuum chamber located closest to the atmosphere.

DESCRIPTION OF THE PREFERRED EMBODIMENT

A preferred embodiment will now be described in detail by referring to the accompanying drawings.

Figure 1:
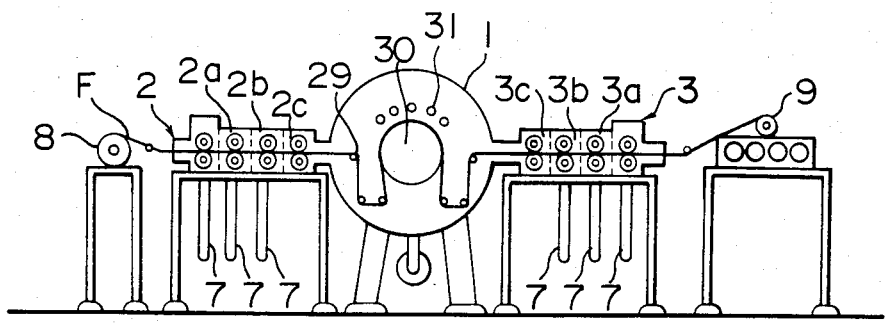
FIG. 1 is a schematic vertical sectional view of the continuous vacuum treating apparatus comprising one embodiment of the invention.
Figure 2:
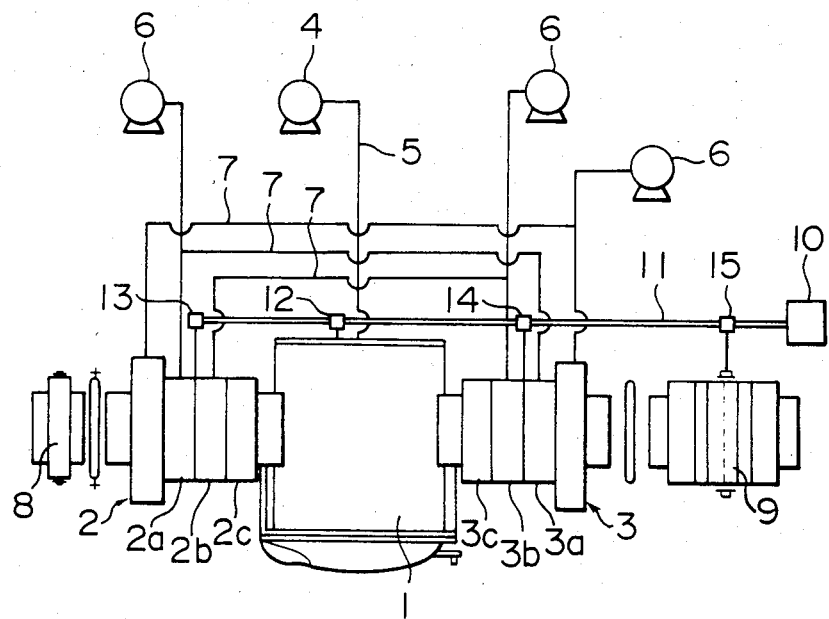
FIG. 2 is a schematic plane view of the continuous vacuum treating apparatus shown in FIG. 1.

Referring to FIGS. 1 and 2, the continuous vacuum treating apparatus comprises a vacuum treating chamber 1 for continuously subjecting a pliable workpiece F which may be a plastic film, formed as of a resin of the vinyl chloride base, to treatment with plasma in a vacuum, a plurality of auxiliary vacuum chambers 2 located anterior to the vacuum treating chamber 1 and a plurality of auxiliary vacuum chambers 3 located posterior to the vacuum treating chamber 1. The vacuum treating chamber 1 is evacuated via an exhaust pipe 5 by a vacuum pump 4 to achieve a pressure of about $10^{-2}$ Torr therein.

The plurality of auxiliary vacuum chambers 2 and 3 are evacuated via exhaust pipes 7 by vacuum pumps 6, to achieve pressures in a vacuum therein which are slightly higher than the pressure achieved in the vacuum treating chamber 1 but successively reduced in one auxiliary vacuum chamber to another from the atmospheric pressure level.

The workpiece F to be treated is fed by feed means 8 through the auxiliary vacuum chambers 2 located anterior to the vacuum treating chamber 1 to the vacuum treating chamber 1 where it is subjected to treatment with plasma, before being moved through the auxiliary vacuum chambers 3 located posterior to the vacuum treating chamber 1 and wound on take-up means 9. A drive motor 10 generates a drive force which is transmitted via a line shaft 11 and stepless transmissions 12, 13, 14 and 15 to the vacuum treating chamber 1 the auxiliary vacuum chambers 2 and 3 and take-up means 9. The speeds of driving systems for the vacuum treating chamber 1, auxiliary vacuum chambers 2 and 3 and take-up means 9 are suitably adjusted by the transmissions 12, 13, 14 and 15, respectively.

Figure 3:
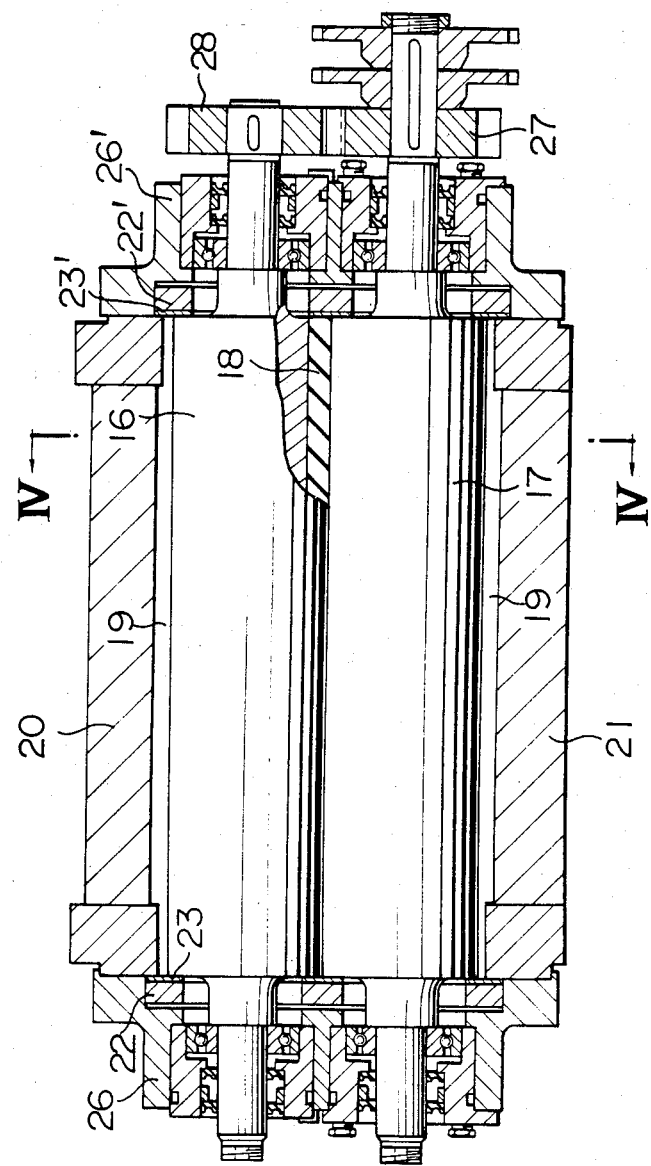
FIG. 3 is a sectional view of one of the auxiliary vacuum chambers of the continuous vacuum treating apparatus shown in FIG. 1, showing the constructional arrangement of the auxiliary vacuum chamber.
Figure 4:
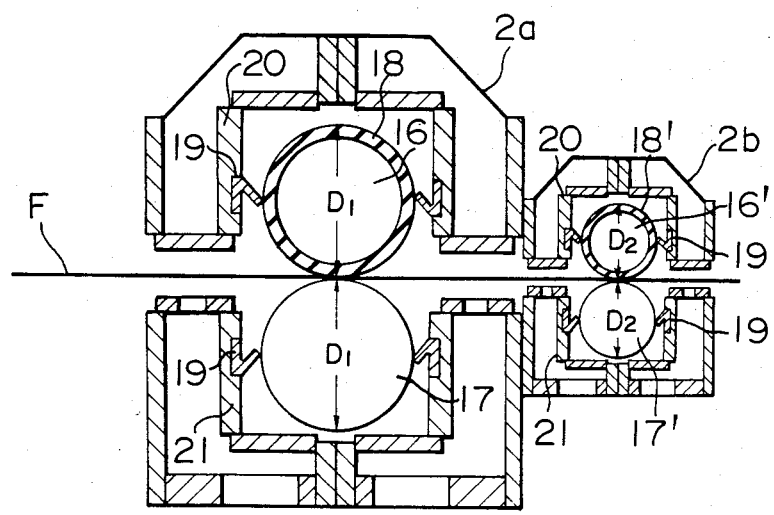
FIG. 4 is a sectional view taken along the line IV—IV in FIG. 3.

FIGS. 3 and 4 show the essential portions of the auxiliary vacuum chambers arranged in a plurality of numbers anterior to the vacuum treating chamber 1. FIGS. 3 and 4 show the auxiliary vacuum chambers located anterior to the vacuum treating chamber 1, but the auxiliary vacuum chambers located posterior to the vacuum treating chamber 1 are similar to those shown in these figures.

Referring to FIGS. 3 and 4, the auxiliary vacuum chamber 2a located closest to the atmosphere and the auxiliary vacuum chamber 2b located adjacent the auxiliary vacuum chamber 2a on a side of opposite the vacuum treating chamber 1 differ from each other in the size of the chamber and the diameter of the seal rolls. More specifically, the auxiliary vacuum chamber 2b nearer the vacuum treating chamber 1 is smaller than the auxiliary vacuum chamber 2a closest to the atmosphere in the size of the chamber and the diameter of the seal rolls. The numerals 16 and 17 designate the upper and lower seal rolls constituting the auxiliary vacuum chamber 2a closest to the atmosphere, the upper seal roll 16 having a coat 18 of resilient material, such as rubber, applied to its outer periphery by baking to become unitary with the seal roll 16 and the lower seal roll 17 having a coat of hard material, such as chromium, nickel, etc., applied to its outer periphery. The upper and lower seal rolls 16 and 17 each have a diameter $D_1$ which is about 250 mm. The numerals 16' and 17' designate upper and lower seal rolls constituting the auxiliary vacuum chamber 2b nearer the vacuum treating chamber 1, the upper seal roll 16' having a coat 18' of resilient material applied to its outer periphery and the lower seal roll 17' having a coat of hard material, such as chromium, nickel, etc., applied to its outer periphery. The upper and lower seal rolls 16' and 17' of the auxiliary vacuum chamber 2b nearer the vacuum treating chamber 1 each have a diameter $D_2$ which is about 100 mm or smaller by about 1/2.5 than the diameter $D_1$ of the seal rolls 16 and 17 of the auxiliary vacuum chamber 2a closest to the atmosphere. In the embodiment shown and described herein, the diameters $D_1$ of the auxiliary vacuum chamber 2a and the diameters $D_2$ of the auxiliary vacuum chambers 2b are described as having a ratio $D_1/D_2$ of about 2.5/1. However, the invention is not limited to this ratio of $D_1$ and $D_2$, and it is possible to keep the deflection of the seal rolls at a level below a predetermined value if the ratio $D_1/D_2$ is in the range between 2/1 and 3/1. The reference numeral 19 designates ripple members secured to upper and lower cases 20 and 21 in positions in which they are in spaced juxtaposed relation and extend axially of the upper and lower seal rolls 16, 16' and 17, 17' along their outer peripheries. 22 and 22' are side pieces providing a seal to opposite end faces of the upper and lower seal rolls 16 and 17. Coats 23 and 23' of fluorine resin are applied by baking to surfaces of the side pieces 22 and 22' which are positioned against the seal rolls 16 and 17 respectively.

Figure 5:
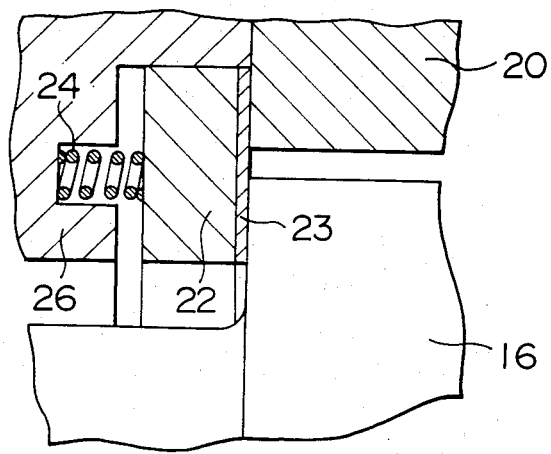
FIGS. 5 and 6 are views in explanation of the manner in which the side piece is mounted in the apparatus according to the invention.
Figure 6:
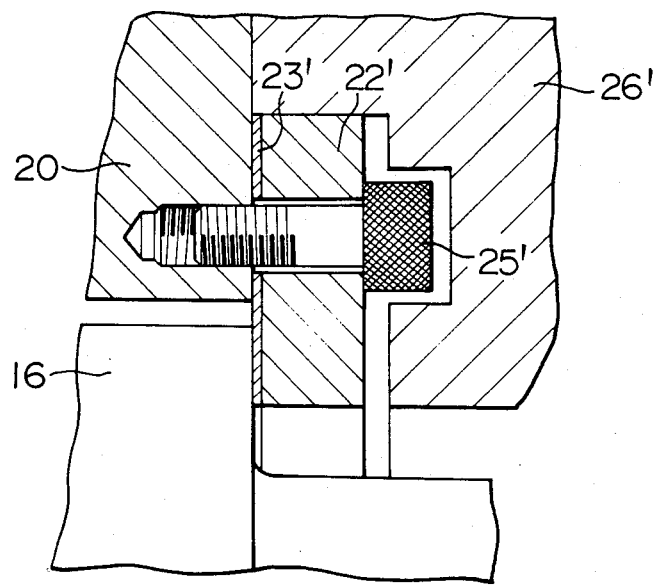

FIGS. 5 and 6 show the manner in which the side pieces 22 and 22' are mounted. As shown, the side pieces 22 and 22' are mounted in such a manner that they are in contact with opposite end faces of the seal rolls 16 and 17 and the cases 20 and 21. The side piece 22 sealing one end face (left end face shown in FIG. 3) is forced by the biasing force of coil springs 24 against the upper and lower seal rolls 16 and 17 and the cases 20 and 21 in a manner to be axially movable. A bearing housing 26 is located in a manner to enclose the side piece 22. By virtue of this structural arrangement, leaks between the side piece 22 and bearing housing 26 can be reduced to a minimum even if the side piece 22 is axially moved together with the seal roll 16 by the thermal expansion of the seal rolls 16 and 17 during operation of the continuous vacuum treating apparatus. This is conducive to increased vacuum maintained in the auxiliary vacuum chambers.

The side piece 22' sealing the other end face (right end face shown in FIG. 3) of the upper and lower seal rolls 16 and 17 is secured by bolts 25' to the cases 20 and 21 so as to be immovable in an axial direction. Like the side piece 22, the side piece 22' is also enclosed by a bearing housing 26'.

For driving the upper and lower seal rolls 16 and 17, a drive force is transmitted from the lower seal roll 17 via gears 27 and 28 shown in FIG. 3 to the upper seal roll 16.

Operation of the continuous vacuum treating apparatus comprising a plurality of auxiliary vacuum chambers of the aforesaid construction located anterior and posterior to the vacuum treating chamber will be described.

The workpiece F, such as a plastic film, is conveyed from the atmosphere side successively through the auxiliary vacuum chambers 2a, 2b and 2c to the vacuum treating chamber 1. At this time, a seal is provided between the upper seal roll 16 and lower seal roll 17 constituting each auxiliary vacuum chamber through which the workpiece F is conveyed by forcing the coat 18 of resilient material on the upper seal roll 16 against the coat of hard material on the lower seal roll 17 so as to deflect the coat 18 of resilient material on the upper seal roll 16. A seal is provided between the upper and lower seal rolls 16 and 17 and the upper and lower cases 20 and 21 by causing the ripple members 19 to be positioned against the upper and lower seal rolls 16 and 17. A seal is provided between the upper and lower seal rolls 16 and 17 and the side piece 22 by forcing the side piece 22 against the upper and lower cases 20 and 21 through the resilient means 24.

A seal is provided to the auxiliary vacuum chambers 2b and 2c located on the vacuum treating chamber side in the same manner as a seal is provided to the auxiliary vacuum chamber 2a closest to the atmosphere.

As described hereinabove, the auxiliary vacuum chamber 2a closest to the atmosphere where the differential pressure is high (between 600 and 700 Torr) is constituted by the pair of seal rolls 16 and 17 of large diameter, so that no deflection develops in the seal rolls 16 and 17 and the workpiece F can be readily conveyed.

In the auxiliary vacuum chambers 2b and 2c of low differential pressure (2 to 150 Torr) located on the vacuum treating chamber side, the diameter of the upper and lower rolls is smaller by about 1/2.5 than that of the upper and lower rolls of the auxiliary vacuum chamber closest to the atmosphere, so that deflection of the seal rolls above a predetermined value can be avoided and the vacuum in the chambers can be kept at a satisfactory level. This enables a high level of vacuum (0.03 Torr) to be achieved in the vacuum treating chamber 1. Since the size of the auxiliary vacuum chambers 2b and 2c is reduced, energy can be conserved through a reduction in the amount of air removed and the drive force for driving each auxiliary vacuum chamber. Returning to the description of the operation, the workpiece F introduced into the vacuum treating chamber 1 is treated with a plasma produced between a treating drum 30 serving as a cathode and a plurality of anodes 31 located around the treating drum 30 after being led to the treating drum 30. Following this treatment in the vacuum treating chamber 1, the workpiece F is continuously led through the auxiliary vacuum chambers 3 located posterior to the vacuum treating chamber 1 to be delivered to the atmosphere side.

Table 1 shows the degree of vacuum achieved in each of the auxiliary vacuum chambers 2a, 2b and 2c (3a, 3b and 3c) in relation to the differential pressure and the speed at which evacuation is accomplished by the vacuum pump. As can be seen clearly in Table 1, the differential pressure in the auxiliary vacuum chamber 2a closest to the atmosphere is markedly higher than that in the auxiliary vacuum chamber 2c nearest the vacuum treating chamber 1. Thus, one only has to take into consideration the axial deflection of the seal rolls 16 and 17 in the auxiliary vacuum chamber 2a closest to the atmosphere where the differential pressure is maximized.

According to the invention, the diameters of the seal rolls constituting the auxiliary vacuum chambers 2b and 2c (3b and 3c) located on the vacuum treating chamber side are made smaller than that of the seal rolls constituting the auxiliary vacuum chamber 2a (3a) closest to the atmosphere. By virtue of this feature, it is possible to avoid the occurrence of an axial deflection of the seal rolls during the time the workpiece F is being conveyed while keeping the level of vacuum in the vacuum treating chamber 1 at a high level, thereby enabling a compact size to be obtained in auxiliary vacuum chambers and allowing energy conservation to be achieved through a reduction in the amount of air removed and in the drive force required for driving the seal rolls.

TABLE 1

|  | Rate of removing air by vaccum pump | Degree of vacuum | Differential pressure |
| --- | --- | --- | --- |
| Atmosphere |  | 760 Torr | 600 to 700 Torr |
| Auxiliary vaccum chamber 2a | 15,000 liter/min | 60 to 160 Torr | |
| | | | 10 to 150 Torr |
| Auxiliary vacuum chamber 2b | 15,000 liter/min | 10 to 50 Torr | |
| | | | 2 to 49.5 Torr |
| Auxiliary vacuum chamber 2c | 7,500 liter/min | 0.5 to 8 Torr | |
| | | | 0.47 to 7.97 Torr |
| Vacuum treating chamber 1 | 40,000 liter/min | 0.03 Torr | |

TABLE 1-continued

|  | Rate of removing air by vaccum pump | Degree of vacuum | Differential pressure |
| --- | --- | --- | --- |

The total rate of removing air: 77,500 liter/min.

Table 2 to Table 4 show the degree of vacuum achieved in each of the auxiliary vacuum chambers 2a, 2b and 2c (3a, 3b and 3c) in relation to the speed at which evacuation is accomplished during the time a workpiece is conveyed continuously through the auxiliary vacuum chambers to the vacuum treating chamber, showing the sealing effects achieved in the auxiliary vacuum chambers and the vacuum treating chamber.

TABLE 2

|  | Degree of vacuum | Rate of removing air by vacuum pump |
| --- | --- | --- |
| Auxiliary vacuum chamber 2a | 60 Torr | 30,000 liter/min |
| Auxiliary vacuum chamber 2b | 20 Torr | 15,000 liter/min |
| Auxiliary vacuum chamber 2c | 1 Torr | 15,000 liter/min |
| Vacuum treating chamber 1 | 0.03 Torr | 40,000 liter/min |

TABLE 3

|  | Degree of vacuum | Rate of removing air by vacuum pump |
| --- | --- | --- |
| Auxiliary vacuum chamber 2a | 200 Torr | 15,000 liter/min |
| Auxiliary vacuum chamber 2b | 65 Torr | 30,000 liter/min |
| Auxiliary vacuum chamber 2c | 6 Torr | 15,000 liter/min |
| Vacuum treating chamber 1 | 0.05 Torr | 40,000 liter/min |

TABLE 4

|  | Degree of vacuum | Rate of Removing air by vacuum pump |
| --- | --- | --- |
| Auxiliary vacuum chamber 2a | 300 Torr | 15,000 liter/min |
| Auxiliary vacuum chamber 2b | 100 Torr | 15,000 liter/min |
| Auxiliary vacuum chamber 2c | 20 Torr | 30,000 liter/min |
| Vacuum treating chamber 1 | 0.3 Torr | 40,000 liter/min |

As can be clearly seen in Table 2 to Table 4, with the total rate of removing air by the vacuum pumps to achieve the vacuum in the vacuum treating chamber and the auxiliary vacuum chambers being constant, the rate of removing air from the auxiliary vacuum chamber 2a closest to the atmosphere had better be raised to keep the vacuum in the vacuum treating chamber 1 at a high level. In this connection, it is to be noted that a rise in the degree of vacuum in the auxiliary vacuum chamber 2a closest to the atmosphere leads to a rise in the level of vacuum in the vacuum treating chamber 1.

What we claim is:

1. A continuous vacuum treating apparatus comprising:

a vacuum treating chamber for continuously treating a workpiece of soft material in a vacuum; and a plurality of auxiliary vacuum chambers located anterior and posterior to said vacuum treating chamber, each of said auxiliary vacuum chambers comprising an upper seal roll and a lower seal roll forming a pair maintained in contact with each other and arranged to extend perpendicular to a direction in which said workpiece of soft material is conveyed, a plurality of pairs of ripple members having the ripple members of each pair being located in spaced juxtaposed relation and extending axially of one of the seal rolls along its outer periphery, and a pair of side pieces each positioned against one of opposite end faces of the pair of upper and lower seal rolls; wherein the improvement resides in that:

the diameter of each of the upper and lower seal rolls of the auxiliary vacuum chambers disposed on the vacuum treating chamber side is made smaller than that of each of the upper and lower seal members of the auxiliary vacuum chamber located closest to the atmosphere.

2. A continuous vacuum treating apparatus as claimed in claim 1, wherein the improvement resides in that the diameter of each of the seal rolls of each of the auxiliary vacuum chambers on the vacuum treating chamber side is about ½ to ⅓ that of each of the seal rolls of the auxiliary vacuum chamber located closest the atmosphere.

3. A continuous vacuum treating apparatus as claimed in claim 1, wherein the improvement resides in that at least one of the upper seal roll and lower seal roll of each of said plurality of auxiliary vacuum chambers between which said workpiece of soft material is inserted has a coat of soft material applied to its outer periphery and extending axially, said coat of soft material being axially deflected to provide a seal axially between the upper and lower seal rolls.

4. A continuous vacuum treating apparatus as claimed in claim 1, wherein the improvement resides in that said vacuum treating chamber is adapted to subject said workpiece of soft material of treatment with plasma.

5. A continuous vacuum treating apparatus as claimed in claim 1, wherein the improvement resides in that each of said side pieces is enclosed by a bearing housing.

* * * * *